United States Patent
Lee et al.

(10) Patent No.: US 7,550,822 B2
(45) Date of Patent: Jun. 23, 2009

(54) DUAL-DAMASCENE METAL WIRING PATTERNS FOR INTEGRATED CIRCUIT DEVICES

(75) Inventors: Boung Ju Lee, Gyeonggi-do (KR); Heon Jong Shin, Gyeonggi-do (KR); Hee Sung Kang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 163 days.

(21) Appl. No.: 11/421,202

(22) Filed: May 31, 2006

(65) Prior Publication Data

US 2007/0032062 A1 Feb. 8, 2007

(30) Foreign Application Priority Data

Aug. 6, 2005 (KR) .................. 10-2005-0072006

(51) Int. Cl.
*H01L 21/10* (2006.01)
(52) U.S. Cl. .................. 257/637; 257/640; 257/751; 257/760; 257/762; 257/763; 257/E21.577; 257/E21.579; 257/E23.144; 257/E23.145; 257/E23.161
(58) Field of Classification Search .......... 438/637; 257/637, 640, 751, 760, 762, 763, E21.577, 257/579, 23.144, 144, 145, 167
See application file for complete search history.

(56) References Cited

U.S. PATENT DOCUMENTS 6,756,672 B1   6/2004   You et al.

2002/0155700 A1   10/2002   Chen et al.
2002/0185671 A1 *  12/2002   Kim ......................... 257/301
2004/0063310 A1 *   4/2004   Ngo et al. ................. 438/637

FOREIGN PATENT DOCUMENTS

JP    2000-323571    11/2000
KR    1020010061583 A   7/2001

* cited by examiner

*Primary Examiner*—Michael S Lebentritt
(74) *Attorney, Agent, or Firm*—Myers Bigel Sibley & Sajovec

(57) ABSTRACT

Methods of forming dual-damascene metal wiring patterns include forming a first metal wiring pattern (e.g., copper wiring pattern) on an integrated circuit substrate and forming an etch-stop layer on the first metal wiring pattern. These steps are followed by the steps of forming an electrically insulating layer on the etch-stop layer and forming an inter-metal dielectric layer on the electrically insulating layer. The inter-metal dielectric layer and the electrically insulating layer are selectively etched in sequence to define an opening therein that exposes a first portion of the etch-stop layer. This opening may include a trench and a via hole extending downward from a bottom of the trench. A first barrier metal layer is formed on a sidewall of the opening and directly on the first portion of the etch-stop layer. A portion of the first barrier metal layer is selectively removed from the first portion of the etch-stop layer. The first portion of the etch-stop layer is then selectively etched for a sufficient duration to expose a portion of the first metal wiring pattern. A second metal wiring pattern is formed in the opening in order to complete a dual-damascene structure.

9 Claims, 7 Drawing Sheets

DUAL-DAMASCENE METAL WIRING PATTERNS FOR INTEGRATED CIRCUIT DEVICES

REFERENCE TO PRIORITY APPLICATION

This application claims priority to Korean Patent Application No. 2005-72006, filed Aug. 6, 2005, the disclosure of which is hereby incorporated herein by reference.

FIELD OF THE INVENTION

The present invention relates to methods of forming metal wiring patterns and, more particularly, to methods of forming metal wiring patterns using dual-damascene techniques and metal wiring patterns formed thereby.

BACKGROUND OF THE INVENTION

Metal wiring patterns used in integrated circuit devices are frequently formed of copper (Cu) because copper has a relatively low resistivity, particularly compared to metal wiring patterns formed of other materials such as aluminum (Al). These metal wiring patterns are frequently separated from each other by intermetal dielectric layers. In order to reduce the parasitic capacitance between adjacent metal wiring patterns and reduce their RC delay, dielectric layers having relatively low dielectric constant values (i.e., low-K dielectrics) have been used as intermetal dielectric layers.

Damascene processing techniques that utilize low-K dielectrics have been used to define copper wiring patterns on integrated circuit substrates. These techniques frequently include forming a low-K dielectric layer on a first copper wiring pattern and then forming via holes and trenches in the low-K dielectric layer, which expose upper surfaces of the first copper wiring pattern. These via holes and trenches are then filled with a copper wiring layer, which may be formed using an electroplating technique. Planarization techniques such as chemical-mechanical polishing (CMP), may then be used to planarize the copper wiring layer into a plurality of second copper wiring patterns and thereby complete a dual-damascene wiring fabrication process.

An example of a conventional dual-damascene processing technique is illustrated by FIGS. 1A-1D. In FIG. 1A, a first low-K dielectric layer 10 is formed on a substrate (e.g., semiconductor substrate). This first low-K dielectric layer 10 may be patterned to define a trench therein, which is subsequently filled with a lower metal line 12 (e.g., copper line). An etch stop layer 14 and an electrically insulating layer 16 (e.g, silicon dioxide) are formed on the first low-K dielectric layer 10, as illustrated. Thereafter, as illustrated by FIG. 1B, a second low-K dielectric layer 17 is formed on the electrically insulating layer 16. Conventional patterning and etching steps are then performed to define a via hole/trench 18 that extends through the second low-K dielectric layer 17, the electrically insulating layer 16 and the etch stop layer 14, and exposes the lower metal line 12. As illustrated, these patterning and etching steps may result in the formation of a via hole 18 that defines a recess in the lower metal line 12. As will be understood by those skilled in the art, the formation of a recess in the lower metal line 12 and the exposure of this recess to an oxygen containing ambient may result in the formation of an oxide residue (not shown) on the lower metal line 12. This oxide residue may be removed by exposing the lower metal line 12 to a wet cleaning solution containing, for example, diluted HF (DHF). However, this exposure to the wet cleaning solution may also result in the formation of undercut regions 20 within the electrically insulating layer 16, which may react with the cleaning solution.

Referring now to FIG. 1C, a step is performed to deposit a first barrier metal layer in the via hole 18 using a physical vapor deposition (PVD) technique, for example. This first barrier metal layer may be a tantalum nitride layer having a thickness in a range from about 50 Å to about 100 Å. This first barrier metal layer operates as a copper diffusion barrier during subsequent processing steps. Unfortunately, the presence of the undercut regions 20 may preclude the formation of a uniform first barrier metal layer on the sidewall of the via hole 18. A directional etching step may then be performed to remove a portion of the first barrier metal layer from an upper surface of the lower metal line 12 and thereby pattern the first barrier metal layer into sidewall barrier segments 22. This removal of the first barrier metal layer from the lower metal line 12 may operate to decrease the contact resistance between lower metal line 12 and a subsequently formed copper plug.

As will be understood by those skilled in the art, the directional etching of the first barrier metal layer to achieve exposure of the upper surface of the lower metal line 12 may result in the formation of resputtered copper spacers 24 on lower sidewalls of the via hole 18. Because of the presence of the undercut regions 20, which may not be sufficiently protected by the sidewall barrier segments 22, copper atoms from the copper spacers 24 may become incorporated into the second low-K dielectric layer 17. Such penetration of copper into the second low-K dielectric layer 17 may increase leakage currents between adjacent metal lines formed in the second low-K dielectric layer 17. This increase in leakage current may degrade device reliability by increasing time dependent dielectric breakdown (TDDB) within the second low-K dielectric layer 17.

Referring now to FIG. 1D, a second barrier metal layer 26 is then conformally deposited into the via hole 18 using, for example, physical vapor deposition (PVD). This second barrier metal layer 26 may be an adhesion enhancing tantalum layer (Ta) having a thickness in a range from about 40 Å to about 200 Å. A blanket copper seed layer (not shown) may then be deposited on the second barrier metal layer 26 and followed by copper electroplating to fill the via hole 18. Planarization techniques may then be performed to define an upper metal line 28 within the via hole 18.

SUMMARY OF THE INVENTION

Embodiments of the present invention include methods of forming an integrated circuit by forming a first metal wiring pattern (e.g., copper wiring pattern) on an integrated circuit substrate and forming an etch-stop layer on the first metal wiring pattern. These steps are followed by forming an electrically insulating layer on the etch-stop layer and forming an inter-metal dielectric layer on the electrically insulating layer. The inter-metal dielectric layer and the electrically insulating layer are selectively etched in sequence to define an opening therein that exposes a first portion of the etch-stop layer. This opening may include a trench and a via hole extending downward from a bottom of the trench. A first barrier metal layer is formed on a sidewall of the opening and directly on the first portion of the etch-stop layer. A portion of the first barrier metal layer is selectively removed from the first portion of the etch-stop layer. This selective removal may be performed using an anisotropic etching step. The first portion of the etch-stop layer is then selectively etched for a sufficient duration to expose a portion of the first metal wiring pattern. During this etching step, the first barrier metal layer is used as an etching mask. A second metal wiring pattern (e.g., upper copper wiring pattern) is then formed in the opening in order to complete a dual-damascene structure.

According to further aspects of these embodiments, the step of forming a second metal wiring pattern may be preceded by a step of forming a second barrier metal layer on the sidewall of the opening and on the exposed portion of the first metal wiring pattern. In the event the second barrier metal layer is formed, then a step may be performed to selectively etch a portion of the second barrier metal layer for a sufficient duration to expose the portion of the first metal wiring pattern.

Still further embodiments of the present invention include methods of forming an integrated circuit by forming a first copper wiring pattern on an integrated circuit substrate and forming an etch-stop layer comprising SiCN on the first copper wiring pattern. A silicon dioxide layer having a thickness in a range from about 100 Å to about 500 Å is formed on the etch-stop layer and a inter-metal dielectric layer comprising SiCOH is formed on the silicon dioxide layer. The inter-metal dielectric layer and the silicon dioxide layer are selectively etched in sequence to define an opening therein that exposes a first portion of the etch-stop layer. A first barrier metal layer comprising tantalum is formed on a sidewall of the opening and directly on the first portion of the etch-stop layer. A portion of the first barrier metal layer is selectively removed from the first portion of the etch-stop layer. The first portion of the etch-stop layer is etched for a sufficient duration to expose a portion of an upper surface of the first copper wiring pattern. During this etching step, the first barrier metal layer is used as an etching mask. A second barrier metal layer containing tantalum is then formed, which extends on the first barrier metal layer, a sidewall of the etch-stop layer and the exposed portion of the first copper wiring pattern. The second barrier metal layer is selectively etched to expose the first copper wiring pattern. A third barrier metal layer containing tantalum is formed on the second barrier metal layer and directly on the first copper wiring pattern. Thereafter, the opening is filled with a second copper wiring pattern to complete the dual-damascene copper interconnect structure.

BRIEF DESCRIPTION OF THE DRAWINGS

FIGS. 2A-2E and 3 are cross-sectional views of intermediate structures that illustrate methods of forming dual-damascene copper interconnect structures for integrated circuits, according to embodiments of the present invention.

DETAILED DESCRIPTION OF PREFERRED EMBODIMENTS

Figure 1A:
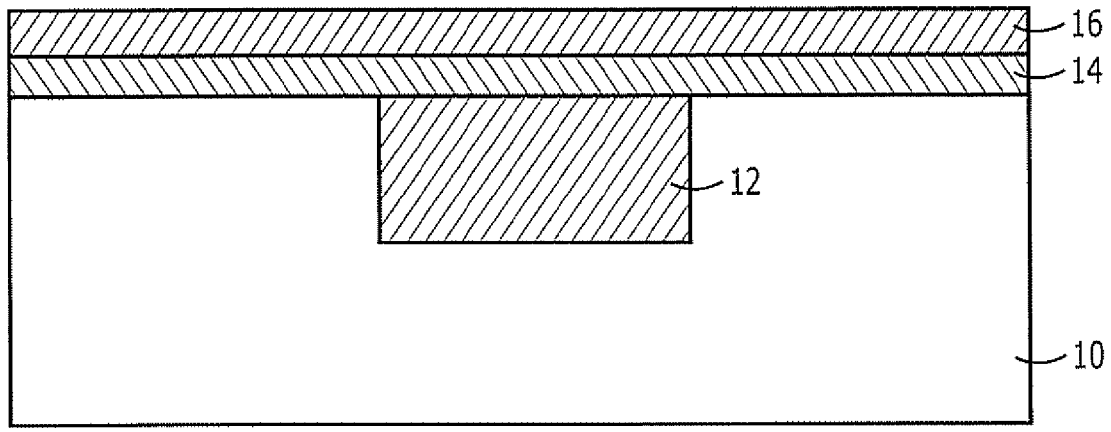
FIGS. 1A-1D are cross-sectional views of intermediate structures that illustrate conventional methods of forming dual-damascene copper interconnect structures for integrated circuits.
Figure 1B:
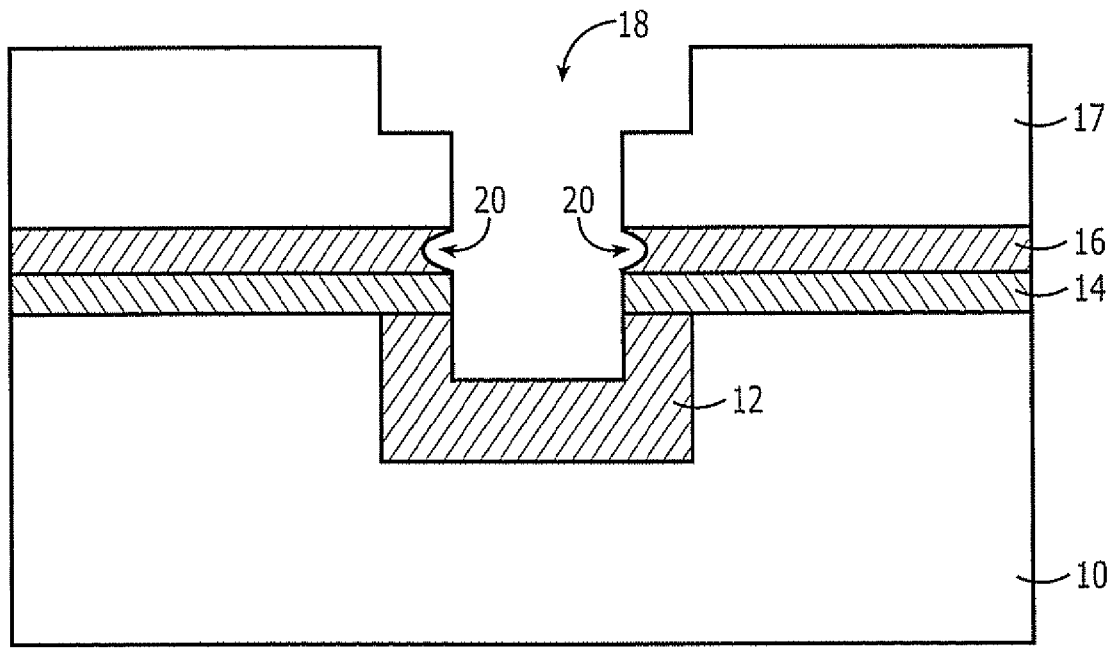
Figure 1C:
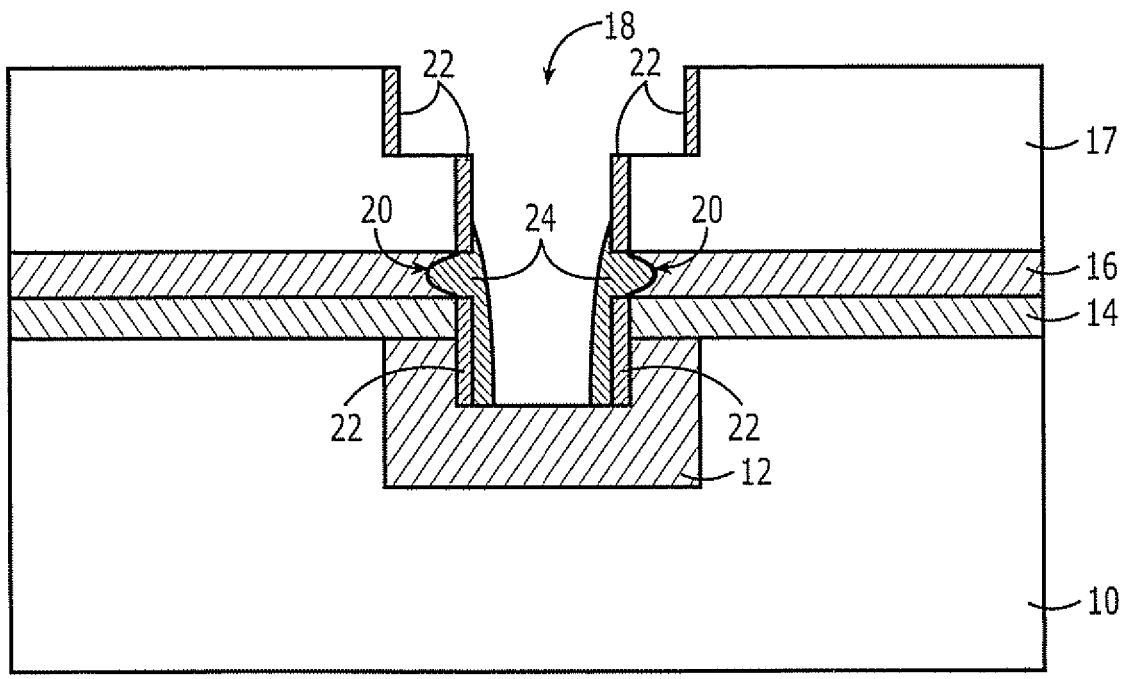
Figure 1D:
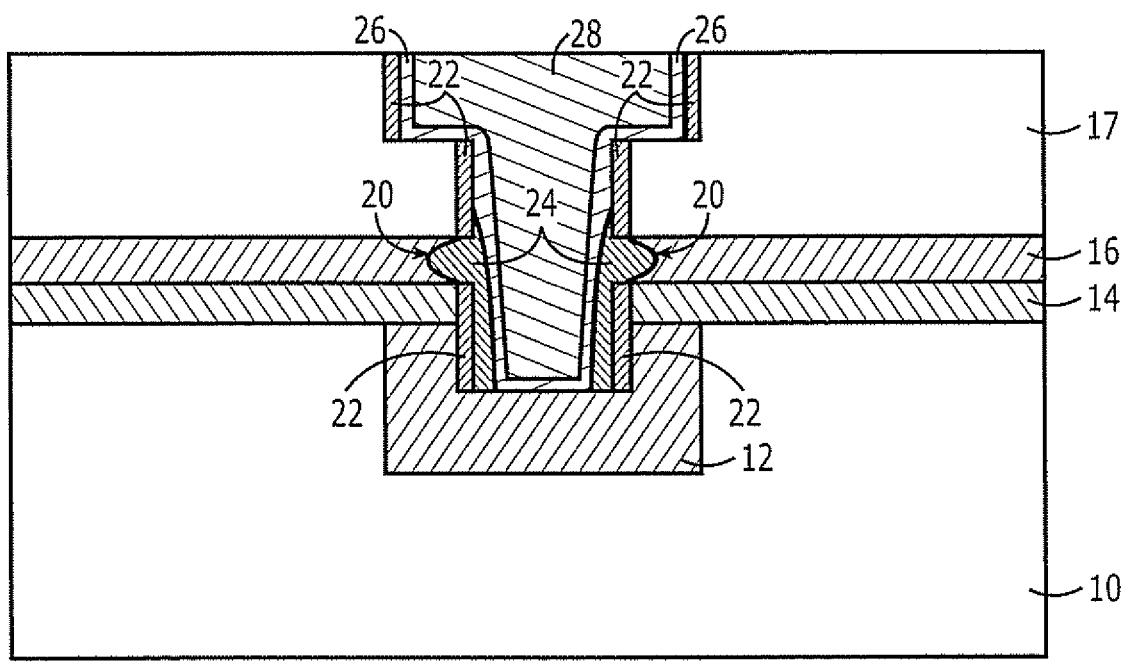

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

Methods of forming dual-damascene copper interconnect structures according to embodiments of the present invention include forming a first dielectric layer 205 on a primary surface of a semiconductor substrate 203 having a plurality of active semiconductor devices (not shown) therein. This first dielectric layer 205 may be a low-K dielectric layer, such as SiCOH, having a thickness in a range from about 2,000 Å to about 20,000 Å. Thereafter, the first dielectric layer 205 is patterned to define a recess/trench therein. This recess/trench is lined with a lower barrier metal layer 207 (e.g., tantalum (Ta)) and filled with a lower metal line 210 (e.g., Copper (Cu)) using conventional techniques. A chemical mechanical polishing (CMP) step may be performed to planarize the lower metal line 210 with an upper surface of the first dielectric layer 205. An etch-stop layer 212 is then deposited onto the first dielectric layer 205. This etch-stop layer 212 may have a thickness in a range from about 200 Å to about 1000 Å and may be formed of a material such as SiCN. The etch-stop layer 212 may be deposited using a chemical-vapor deposition (CVD) technique, for example.

Figure 2A:
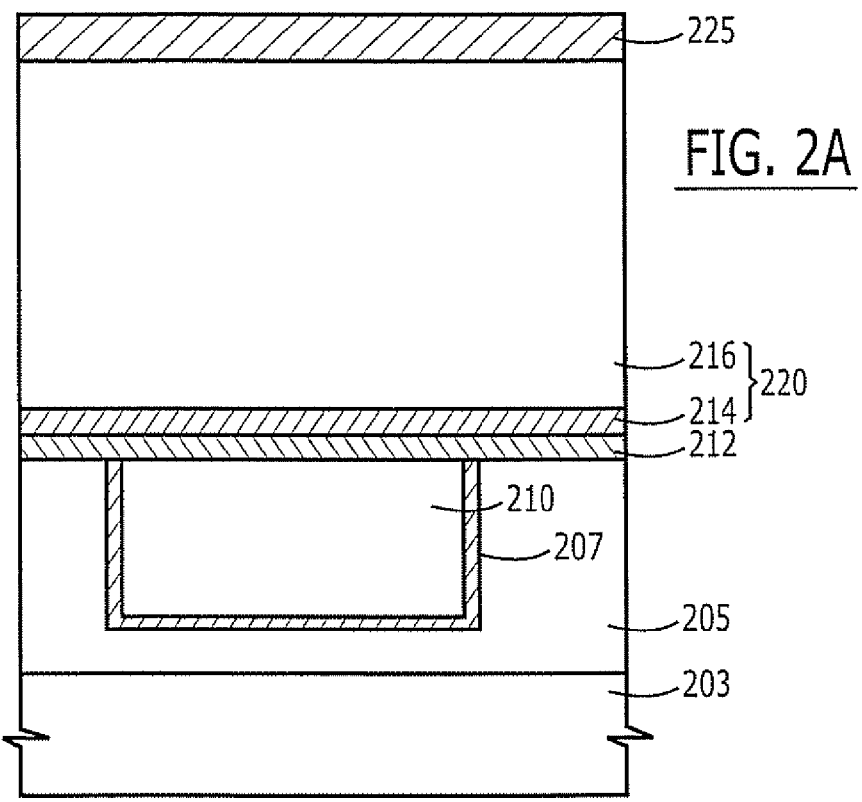
FIGS. 2A-2H are cross-sectional views of intermediate structures that illustrate methods of forming dual-damascene copper interconnect structures for integrated circuits, according to embodiments of the present invention.

Referring still to FIG. 2A, a second interlayer-dielectric layer 220 is formed on the etch-stop layer 212. This second interlayer-dielectric layer 220 includes a first insulating layer 214, which may be formed of silicon dioxide, and a second insulating layer 216, which may be a low-K dielectric layer (e.g., SiCOH layer). The first insulating layer 214 may have a thickness in a range from about 100 Å to about 5000 Å and the second insulating layer 216 may have a thickness in a range from about 2,000 Å to about 10,000 Å. A hard mask layer 225 is deposited onto the second interlayer-dielectric layer 220. This hard mask layer 225 may be a silicon dioxide layer having a thickness in a range from about 200 Å to about 1,500 Å.

Figure 2B:
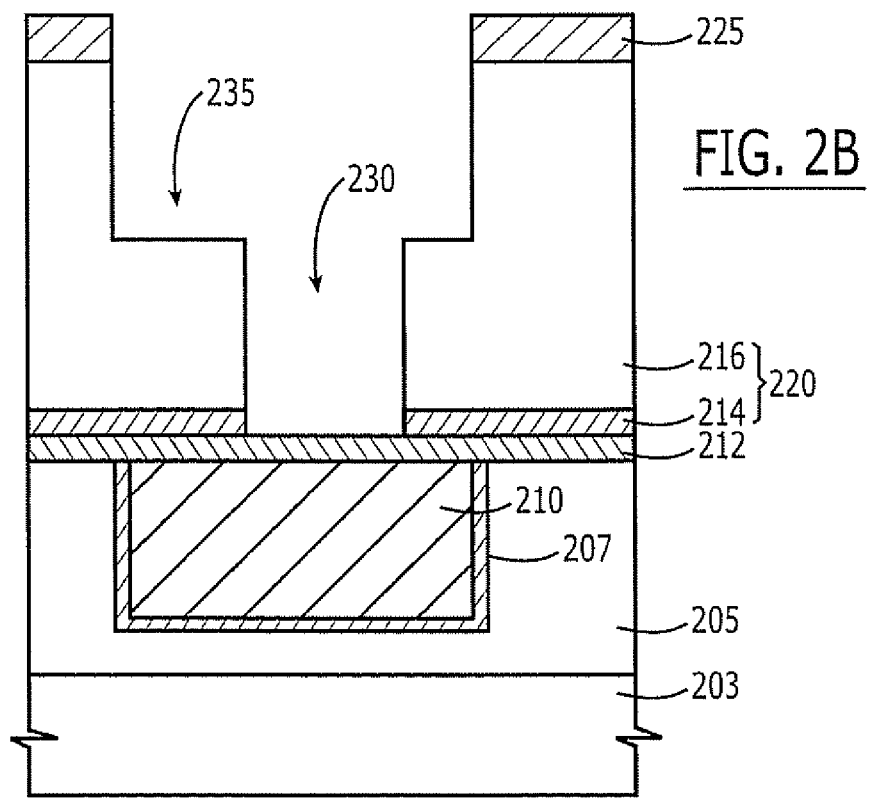

Referring now to FIG. 2B, a plurality of selective etching and patterning steps (e.g., photolithographically-defined etching steps) are then performed on the structure illustrated by FIG. 2A. In particular, the hard mask layer 225 and the second interlayer-dielectric layer 220 are selectively etched to define a via hole 230 and a trench 235 therein, as illustrated. The via hole 230 may be a generally cylindrical via hole 230 of limited lateral dimension, but the trench may be substantially larger and extend laterally as a trench pattern in a third dimension (not shown). The etch-stop layer 212 is configured to block exposure of the lower metal line 210 during the selective etching steps to define the via hole 230.

Figure 2C:
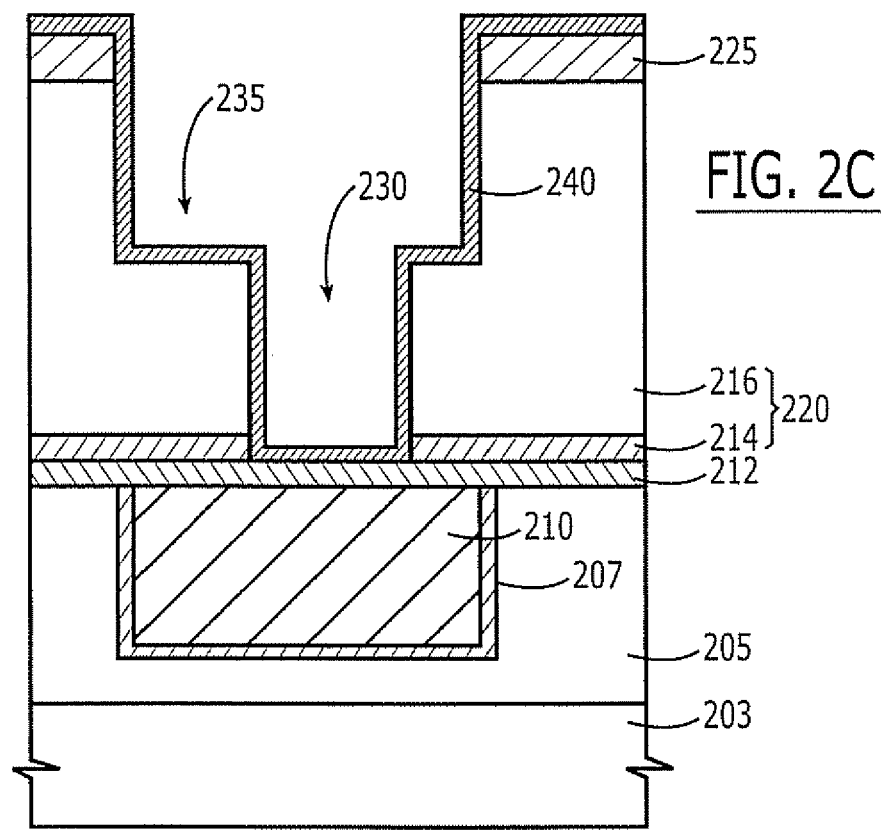
Figure 2D:
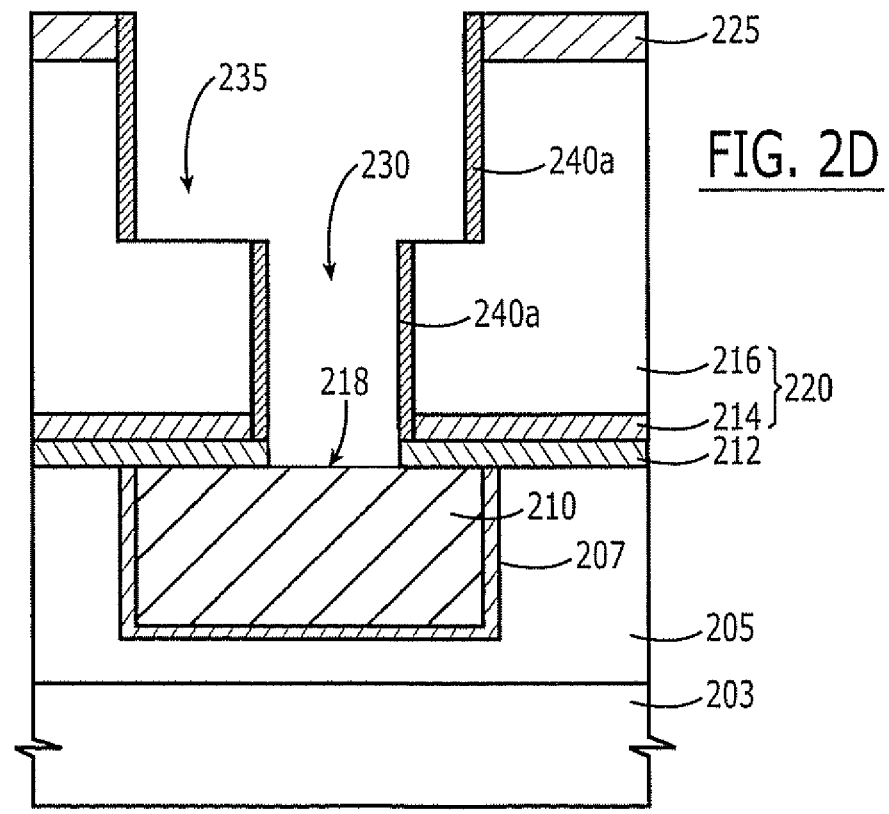

Referring now to FIG. 2C, a first barrier metal layer 240 is then conformally deposited onto the structure illustrated by FIG. 2B. This first barrier metal layer 240, which lines sidewalls of the trench 235 and via hole 230, may be a tantalum layer, a tantalum nitride layer or a composite layer containing tantalum and tantalum nitride. The first barrier metal layer 240 may have a thickness in a range from about 30 Å to about 100 Å. Thereafter, as illustrated by FIG. 2D, an anisotropic etching step is performed to selectively etch horizontal portions of the first barrier metal layer 240 and define first barrier metal layer spacers 240a on sidewalls of the via hole 230 and trench 235. These first barrier metal layer spacers 240a may then be used as an etching mask during an etching step that selectively removes an exposed portion of the etch-stop layer 212. This removal of an exposed portion of the etch-stop layer 212 results in an exposure of a portion of an upper surface 218 of the lower metal line 210.

Any formation of a native oxide on the exposed portion of the upper surface 218 of the lower metal line 210 may be removed using a wet cleaning process. This cleaning process may involve exposing the surface 218 to a cleaning solution containing diluted hydrofluoric acid (DHF). During this cleaning process, the first barrier metal layer spacers 240a operate to inhibit lateral chemical etching of the first insulating layer 214 by DHF. Alternatively, a sputter etching technique may be used to remove any native oxide from the upper surface 218.

Figure 2E:
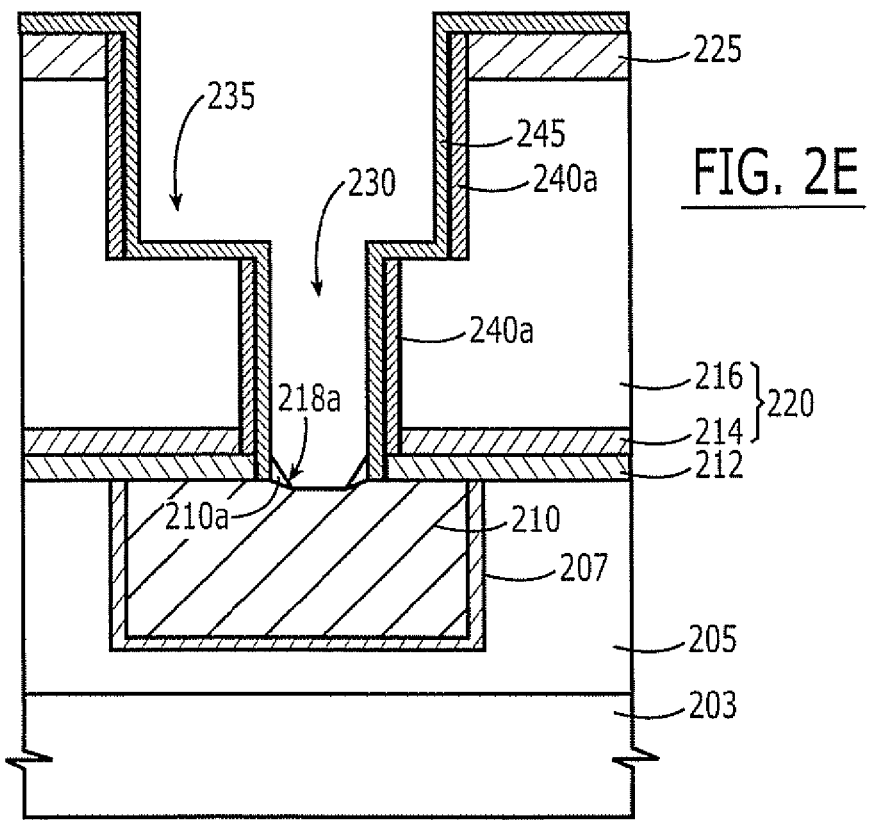

Referring now to FIG. 2E, a second barrier metal layer 245 is then conformally deposited into the via hole 230 and trench 235 in order to cover and protect exposed portions of the second insulating layer 216 and cover and protect exposed sidewalls of the etch-stop layer 212. This second barrier metal layer 245 may be a tantalum layer, a tantalum nitride layer or a composite layer containing tantalum and tantalum nitride. This second barrier metal layer 245 may have a thickness in a range from about 30 Å to about 100 Å. A step is then performed to remove a portion of the second barrier metal layer 245 that extends on the upper surface of the lower metal line 210. This removal step, which may be performed as a sputter etching step, may result in a partial removal and resputtering of the lower metal line 210 onto sidewalls of the second barrier metal layer 245, to thereby define a recessed surface 218a of the lower metal line 210. These resputtered portions of the lower metal line 210, which may have a thickness in a range from about 10 Å to about 300 Å, are identified by the reference numeral 210a.

Figure 2F:
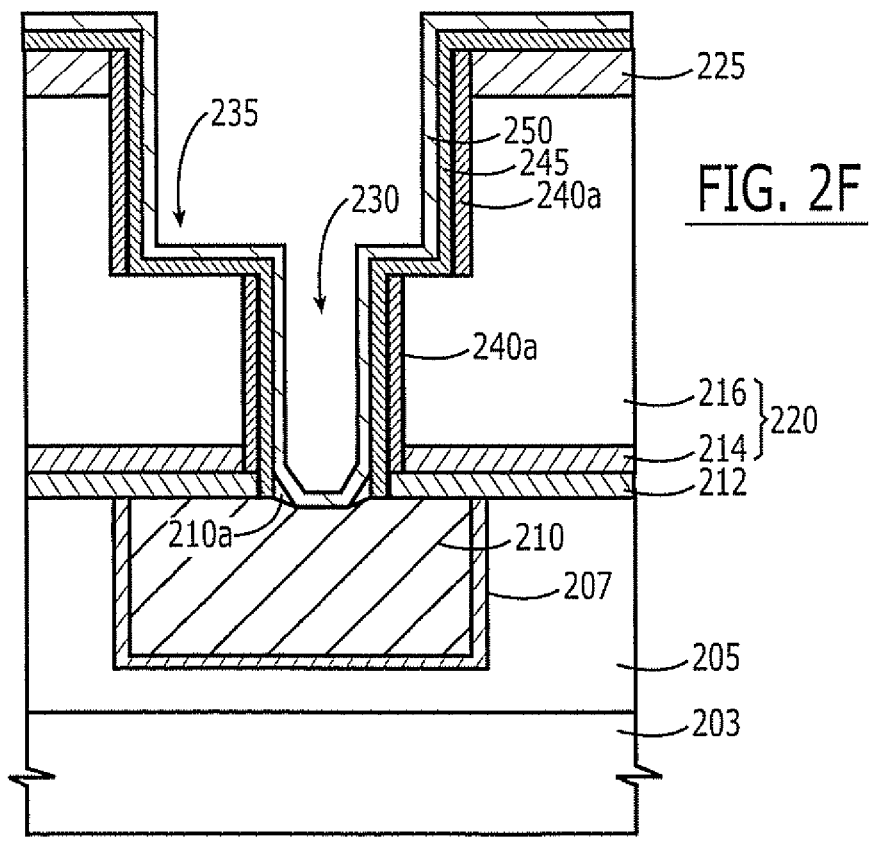

Referring now to FIG. 2F, a third barrier metal layer 250 is then conformally deposited into the via hole 230 and trench 235 to thereby cover the second barrier metal layer 245. This third barrier metal layer 250 may have a thickness in a range from about 100 Å to about 500 Å. The third barrier metal layer 250 may be formed as a tantalum or tantalum nitride layer, however, tantalum is typically preferred because it has a lower resistivity relative to tantalum nitride.

Figure 2G:
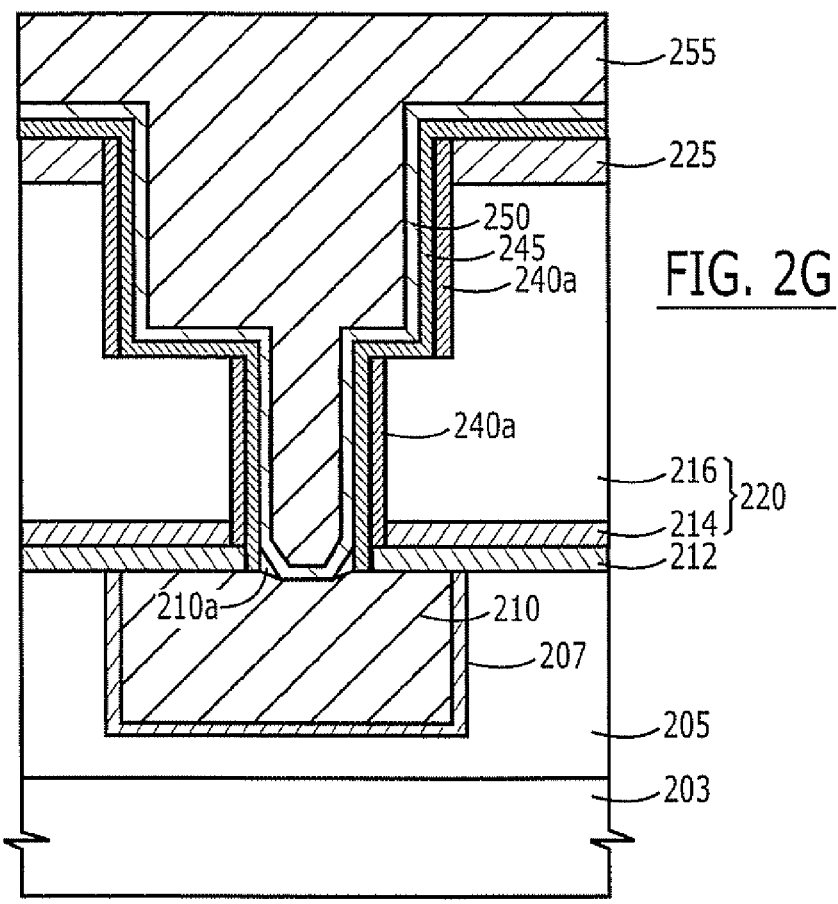
Figure 2H:
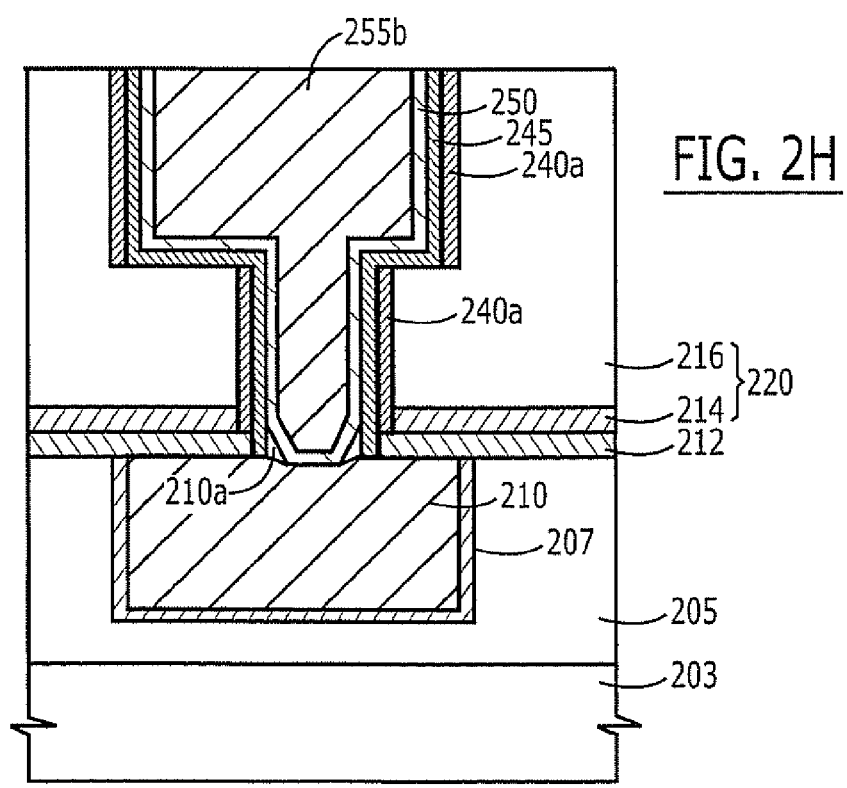

Finally, as illustrated by FIGS. 2G-2H, a metallization layer 255 is then deposited onto the structure of FIG. 2F to thereby completely fill the via hole 230 and trench 235. This metallization layer 255 may be deposited by electroplating copper from a copper seed layer (not shown) formed within the via hole 230. In alternative embodiments, the metallization layer 255 may be formed using chemical vapor deposition (CVD) and/or physical vapor deposition (PVD) techniques. The metallization layer 255 is then planarized to define an upper metal line 255b in the trench 235, which extends in a third dimension (not shown), and define a metal plug 255a within the via hole 230. This planarization step may be performed by chemically-mechanically polishing the metallization layer 255 for a sufficient duration to expose the second insulating layer 216.

Figure 3:
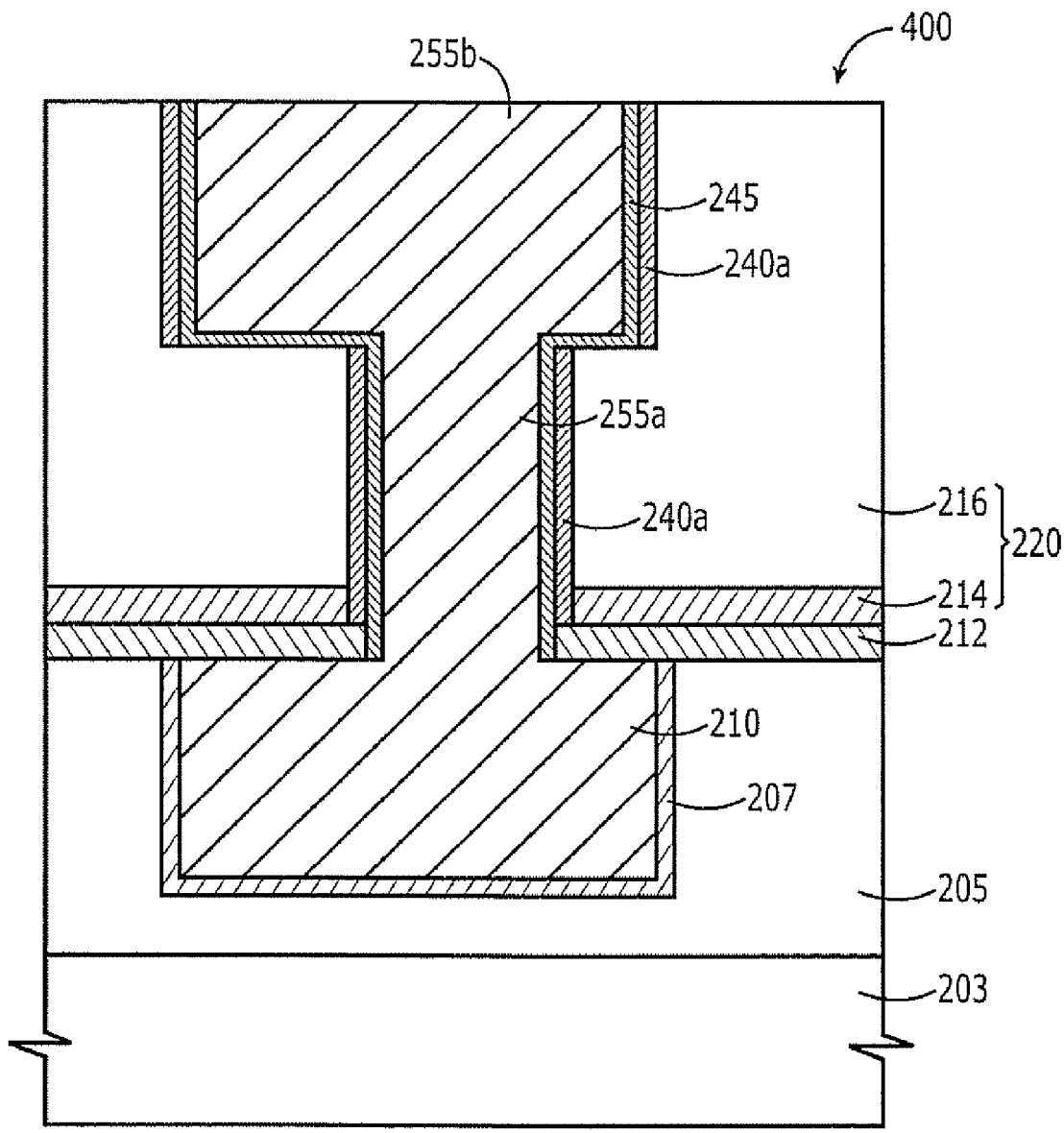

Still further embodiments of the present invention are illustrated by FIGS. 2A-2E and 3. In particular, FIG. 3 illustrates the steps of depositing a metallization layer 255 onto the structure of FIG. 2E to thereby completely fill the via hole 230 and trench 235. This metallization layer 255 may be deposited by electroplating copper from a copper seed layer (not shown) formed within the via hole 230. In alternative embodiments, the metallization layer 255 may be formed using chemical vapor deposition (CVD) and/or physical vapor deposition (PVD) techniques. The metallization layer 255 is then planarized to define an upper metal line 255b in the trench 235, which extends in a third dimension (not shown), and define a metal plug 255a within the via hole 230. This planarization step may be performed by chemically-mechanically polishing the metallization layer 255 for a sufficient duration to expose the second insulating layer 216.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A dual-damascene wiring pattern of an integrated circuit, comprising:
   a first metal wiring pattern on an integrated circuit substrate;
   an inter-metal dielectric layer extending on the integrated circuit substrate, said inter-metal dielectric layer having a via hole therein that extends opposite an upper surface of said first metal wiring pattern;
   a first barrier metal layer lining a sidewall of the via hole;
   an etch-stop layer extending between the upper surface of said first metal wiring pattern and said inter-metal dielectric layer, said etch-stop layer having an opening therein that is self-aligned to said first barrier metal layer so that an inner sidewall of the opening in the etch-stop layer is vertically aligned with an inner sidewall of said first barrier metal layer; and
   a second metal wiring pattern that extends into the via hole and opening, and is electrically connected to said first metal wiring pattern.

2. The wiring pattern of claim 1, wherein the inter-metal dielectric layer comprises a first insulating layer and a second insulating layer formed on the first insulating layer.

3. The wiring pattern of claim 2, wherein the first insulating layer is an oxide layer and the second insulating layer has a dielectric constant less than a dielectric constant of the oxide layer.

4. The wiring pattern of claim 3, wherein the second insulating layer is an SiCOH layer and the etch-stop layer is an SiCN layer.

5. The wiring pattern of claim 1, wherein the first metal wiring pattern is a copper metal wiring pattern.

6. The wiring pattern of claim 1, further comprising a second barrier metal layer that lines a sidewall of the opening in the etch-stop layer.

7. The wiring pattern of claim 6, further comprising a third barrier metal layer that extends between a sidewall of the etch-stop layer and the second metal wiring pattern.

8. The wiring pattern of claim 7, wherein the first barrier metal layer comprises tantalum nitride and the third barrier metal layer comprises tantalum.

9. A wiring pattern of an integrated circuit, comprising:
   a first electrically conductive pattern on an integrated circuit substrate;
   a second electrically insulating layer on the integrated circuit substrate, said first electrically conductive pattern having a via hole therein that extends opposite an upper surface of said first electrically conductive pattern;
   a first barrier metal layer lining a sidewall of the via hole;
   a first electrically insulating layer extending between the upper surface of the first electrically conductive pattern and said second electrically insulating layer, said first electrically insulating layer having an opening therein that is self-aligned to said first barrier metal layer so that an inner sidewall of the opening in the first electrically insulating layer is vertically aligned with an inner sidewall of said first barrier metal layer; and
   a second electrically conductive pattern that extends into the via hole and opening, and is electrically connected to said first electrically conductive pattern.

* * * * *